(12) United States Patent
Ohsumi

(10) Patent No.: US 7,045,908 B2
(45) Date of Patent: May 16, 2006

(54) SEMICONDUCTOR DEVICE AND METHOD FOR MANUFACTURING THE SAME

(75) Inventor: Takashi Ohsumi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/747,317

(22) Filed: Dec. 30, 2003

(65) Prior Publication Data

US 2004/0201097 A1    Oct. 14, 2004

(30) Foreign Application Priority Data

Apr. 14, 2003    (JP) .............................. 2003-109378

(51) Int. Cl.
*H01L 23/48*    (2006.01)

(52) U.S. Cl. ...................... 257/797; 257/750; 257/758; 438/401; 438/612

(58) Field of Classification Search ................ 438/401, 438/612, 975; 257/750, 758, 797
See application file for complete search history.

(56) References Cited

U.S. PATENT DOCUMENTS 6,703,328 B1 *    3/2004    Tanaka et al. ............... 438/462
6,740,577 B1 *    5/2004    Jin et al. ..................... 438/612

FOREIGN PATENT DOCUMENTS

JP         2000-260733         9/2000

* cited by examiner

*Primary Examiner*—Zandra V. Smith
*Assistant Examiner*—Christy Novacek
(74) *Attorney, Agent, or Firm*—Rabin & Berdo, PC

(57) ABSTRACT

A semiconductor device which is manufactured through a process of forming a second structure on a first structure, by using a photolithography technique, the semiconductor device includes a mark which is provided at a part of the first structure to be covered by the second structure and which is necessary for forming the second structure.

5 Claims, 12 Drawing Sheets

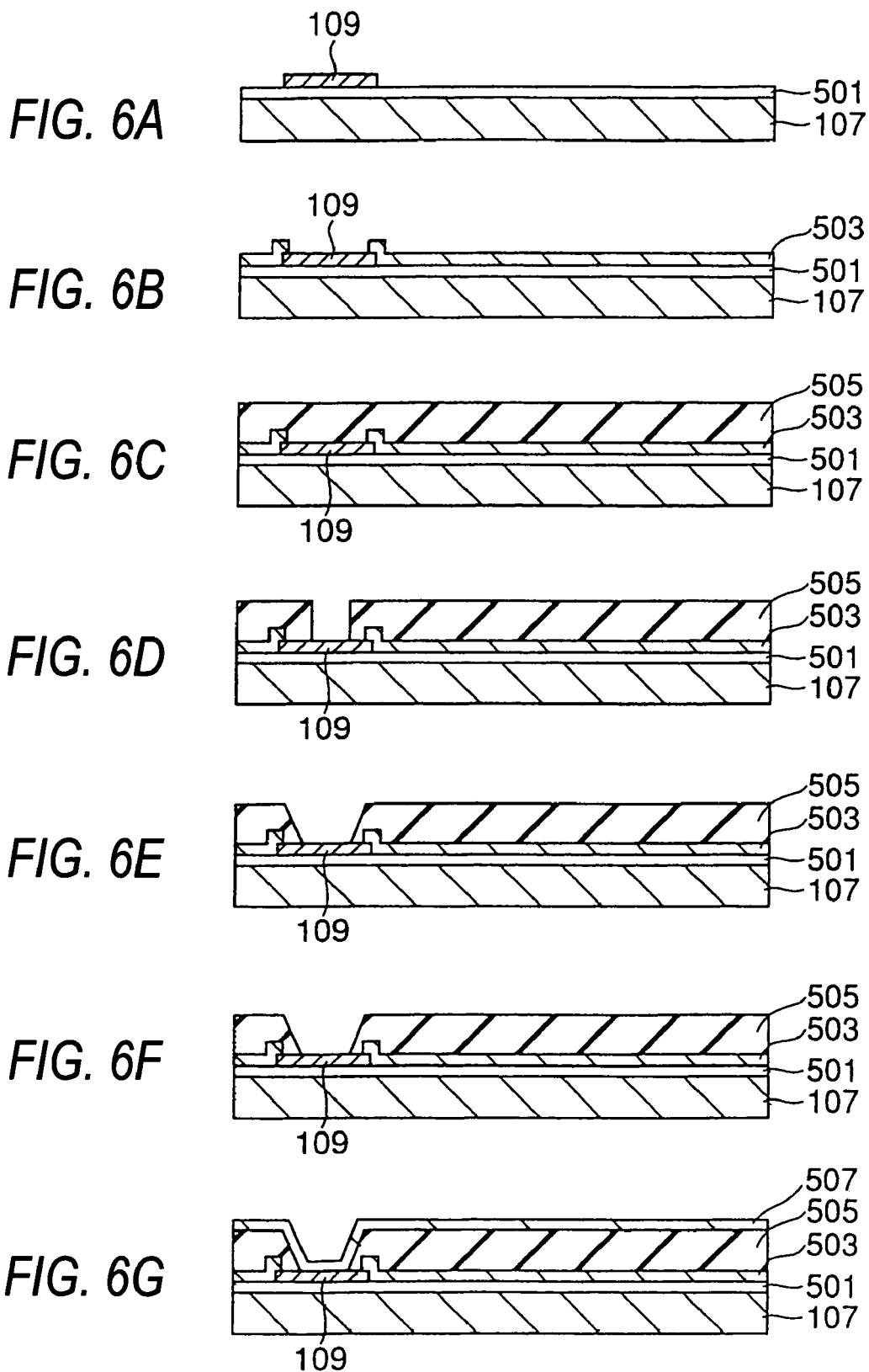

SEMICONDUCTOR DEVICE AND METHOD FOR MANUFACTURING THE SAME

BACKGROUND OF THE INVENTION

1. Field of the Invention

This invention relates to a semiconductor device and a method for manufacturing the same. Particularly, this invention relates to a semiconductor device and a method for manufacturing the same for improving alignment accuracy in a photolithography process.

This application is counterpart of Japanese patent application, Serial Number 109378/2003, filed Apr. 14, 2003, the subject matter of which is incorporated herein by reference.

2. Description of the Related Art

As portable apparatuses have been miniaturized, miniaturization of semiconductor devices aboard portable apparatuses has been demanded. In response to this demand, a semiconductor device called chip size package, having substantially the same outer dimension as the outer dimension of a semiconductor chip, has appeared. As a form of chip size package, there is a semiconductor device called wafer level chip size package or wafer level chip scale package.

Such a wafer level chip size package (hereinafter referred to as WCSP) has a columnar electrode with a relatively large height. (The columnar electrode is also referred to as a post electrode or a bump electrode.) The reason for providing a columnar electrode is to increase the distance between a semiconductor substrate and a mounting board. By increasing this distance, it is possible to relax the stress caused by the difference between the coefficient of thermal expansion of the semiconductor substrate and the coefficient of thermal expansion of the mounting board.

The column are electrode is formed by the following process.

A dry photoresist is formed on an entire semiconductor substrate including redistribution wiring. Through this dry photoresist, the outer shape of a land part (a part that will later become a bottom side of a columnar electrode) of the redistribution wiring is recognized by a mark detector of an optical device such as a stepper. As a result, the position of the land part is recognized by the optical device. On the basis of this position information, alignment between a mask for forming a columnar electrode and the semiconductor substrate (semiconductor wafer) is carried out. (That is, mask alignment is carried out.) Next, the dry photoresist is exposed on the basis of a pattern on the mask. Next, development processing is carried out and the surface of the land part of the redistribution wiring is exposed. On the exposed surface of the landpart, a columnar electrode having a predetermined height is formed by electroplating processing.

In a WCSP dicing process (scribing process), the position of the columnar electrode or the position of an external terminal formed on the columnar electrode is used as a mark for recognizing a dicing position (scribing position). Therefore, if the position where the columnar electrode is to be formed deviates from a preset position (intended position on the redistribution wiring), also the dicing position deviates from a preset position. In short, the position where the columnar electrode is to be formed is one of important elements to decide the accuracy of the dicing process. Therefore, to improve the accuracy of the dicing process, the above-described mask alignment must be carried out accurately.

As a related technique for accurately recognizing a scribing line, for example, there is a technique described in the following literature (see, for example, Patent Literature 1).

Patent Literature 1: Japanese Patent No. 3,065,309 (FIGS. 3 and 4)

However, in WCSP, the columnar electrode having a relatively large height (height: about 100 micrometers ($\mu$m)) is necessary for relaxing stress, as described above. Therefore, the dry photoresist for forming the columnar electrode must have a thickness of at least approximately 120 micrometers. In the above-described mask alignment process, since this relatively thick (120-micrometer) dry photoresist exists between the mark detector of the optical device and the land part, the visibility of the land part is not good. Therefore, the accuracy of recognizing the position of the land part by the optical device is lowered. This means that the mask alignment based on the outer shape of the land part of the redistribution wiring increases an error in alignment. As a result, the position where the columnar electrode is to be formed and the dicing position may deviate from preset values.

To improve the accuracy of the above-described mask alignment, it may be considered effective to form a dedicated alignment mark for forming the columnar electrode in an area that is different from the area where the redistribution wiring is formed. However, the provision of the dedicated alignment mark increases the chip size, which is not preferable.

Therefore, a semiconductor device and a method for manufacturing the same that enable improvement in the alignment accuracy without increasing the chip size are desired.

Moreover, a semiconductor device and a method for manufacturing the same that enable improvement in the accuracy of the dicing process are desired.

SUMMARY OF THE INVENTION

This invention is conceived in order to overcome the above-described problem. Of the invention disclosed in this application, a typical semiconductor device has the following outline.

Specifically, a semiconductor device is manufactured through a process of forming a second structure on a first structure, using a photolithography technique. A mark necessary for forming the second structure is provided at a part of the first structure to be covered by the second structure.

Of the invention disclosed in this application, a typical method for manufacturing a semiconductor device has the following outline.

Specifically, a method (1) for manufacturing a semiconductor device comprising the steps of:

(a) preparing a semiconductor substrate having a major surface on which a circuit element is formed;

(b) forming an electrode pad electrically connected with the circuit element, on the major surface;

(c) forming an insulting film on the major surface so as to expose a part of the electrode pad;

(d) forming a wiring extending from the electrode pad to a surface of the insulating film and having a recess part formed on a surface of the wiring, the recess part being positioned over a predetermined area of the insulating film;

(e) forming a mask layer on the insulating film so as to expose the recess part and the wiring adjacent to the recess part;

(f) selectively forming a conductive member using the mask layer as a mask, in the recess part and on the exposed wiring;

(g) removing the mask layer;

(h) forming a sealing resin on the insulating film so as to cover the wiring and a side of the conductive member; and (i) forming an external terminal on the conductive member.

Furthermore, in the method (1), the step (e) includes forming the mask layer using the recess part as an alignment mark.

Furthermore, in the method (1), further comprising: after the step (e), checking a distance between the recess part and the mask layer.

Of the invention disclosed in this application, a typical method for manufacturing a semiconductor device has the following outline.

Specifically, a method (2) for manufacturing a semiconductor device comprising the steps of:

(a) preparing a semiconductor substrate having a major surface on which a circuit element is formed;

(b) forming an electrode pad electrically connected with the circuit element, on the major surface;

(c) forming a first insulating film on the major surface to expose a part of the electrode pad;

(d) forming a first wiring layer extending from the electrode pad to a surface of the first insulating film;

(e) forming a second insulating film having a first recess part exposing a part of the first wiring layer and a second recess part, on the first insulating film;

(f) forming a mask layer on the second insulating film so as to expose a predetermined area of a surface of the second insulating film including the first recess part and the second recess part;

(g) selectively forming a second wiring layer, using the mask layer as a mask, on the first recess part, on the second recess part and on the predetermined area of the surface of the second insulating film;

(h) removing the mask layer;

(i) forming a sealing resin on the second wiring layer and on the second insulating layer; and (j) forming an external terminal electrically connected with the second wiring layer.

Furthermore, in the method (2), the step (f) includes forming the mask layer using the second recess part as an alignment mark.

Furthermore, in the method (2), further comprising: after the step (f), checking a distance between the second recess part and the mask layer.

Of the invention disclosed in this application, the effects of the typical semiconductor device are briefly described as follows.

Specifically, according to the semiconductor device of this invention, a mark functioning as a mask alignment mark or functioning as a mark for checking a positional gap is formed simultaneously in the process of forming the first structure. Therefore, the alignment accuracy can be improved without adding any special process step.

Moreover, this mark is formed in the first structure itself. Therefore, it does not increase the chip size.

Furthermore, this mark is completely embedded in the conductive layer, which is formed later. Therefore, the strength and the electrical properties of the semiconductor device are not lowered.

As a result, the accuracy of the scribing process can be improved while the above-described effects are maintained.

BRIEF DESCRIPTION OF THE DRAWINGS

FIGS. 6A to 6G are process diagrams showing a method for manufacturing a semiconductor device 100 of a first embodiment of this invention.

DETAILED DESCRIPTION OF THE PREFERRED EMBODIMENTS

Hereinafter,preferred embodiments of this invention will be described in detail with reference to the drawings.

To make the description easy to understand, the same structural elements are denoted by the same numerals. The same structure will not be described repeatedly.

(First Embodiment)

First, the structure of a semiconductor device 100 of this invention will be described with reference to FIGS. 1 to 5.

Figure 1:
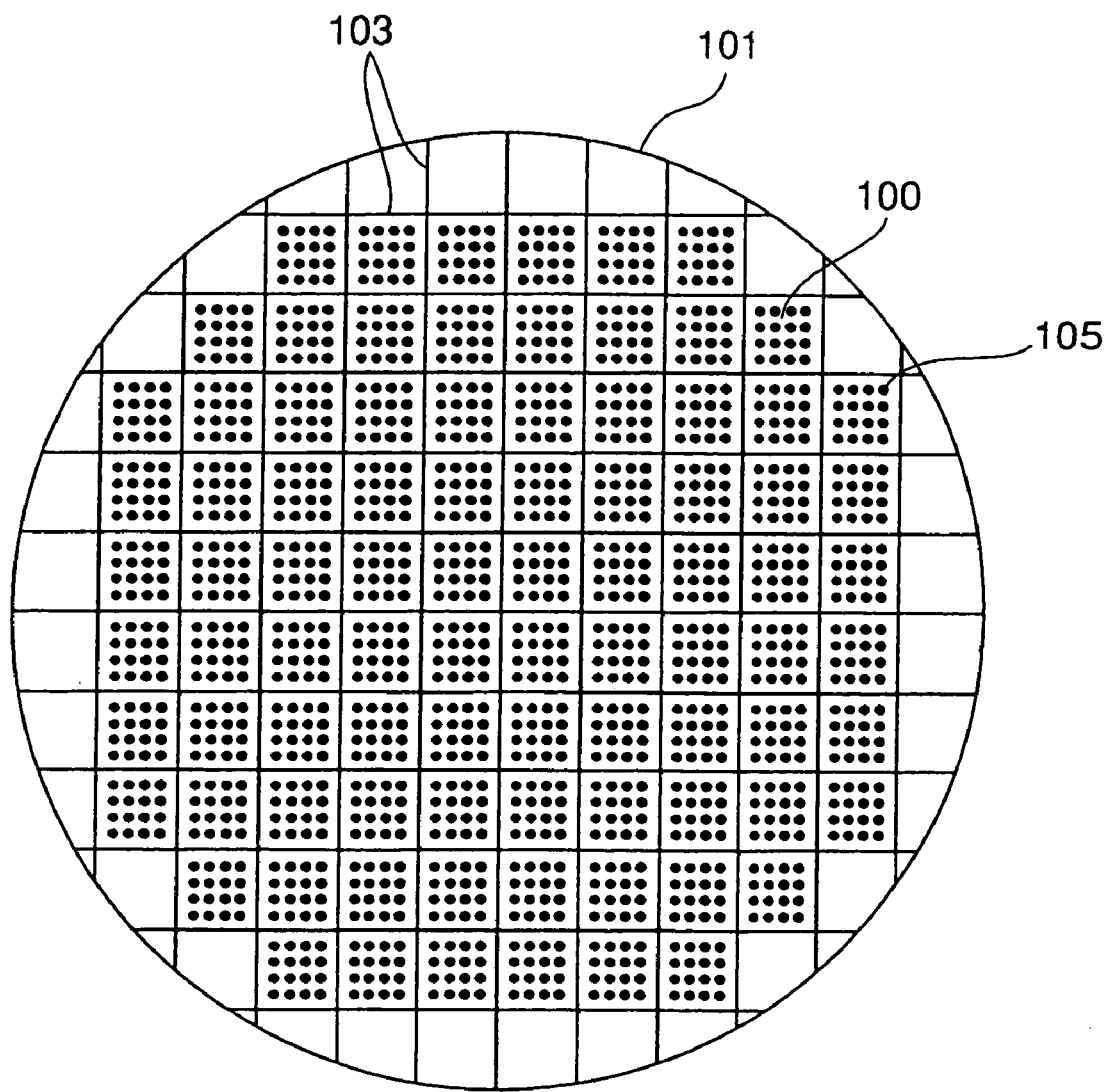
FIG. 1 is a plan view showing a face side of a semiconductor wafer 101.

FIG. 1 is a plan view showing a face side of a semiconductor wafer 101.

FIG. 1 shows a state where plural semiconductor devices 100 before being cut out as individual pieces are arranged along plural scribing lines 103. The semiconductor devices 100 are WCSPs as described above and parts indicated by black dots are external terminals 105. The plural semiconductor devices 100 are cut out as individual pieces from this semiconductor wafer 101.

Figure 2:
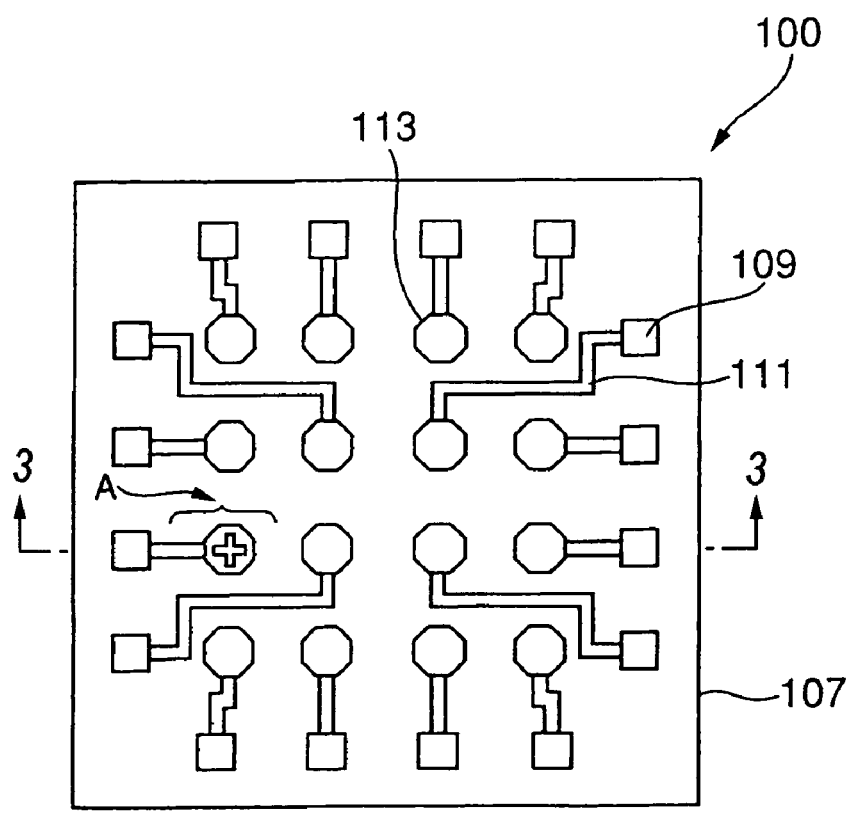
FIG. 2 shows a face side of a semiconductor device 100 after it is cut out as an individual piece.
Figure 3:
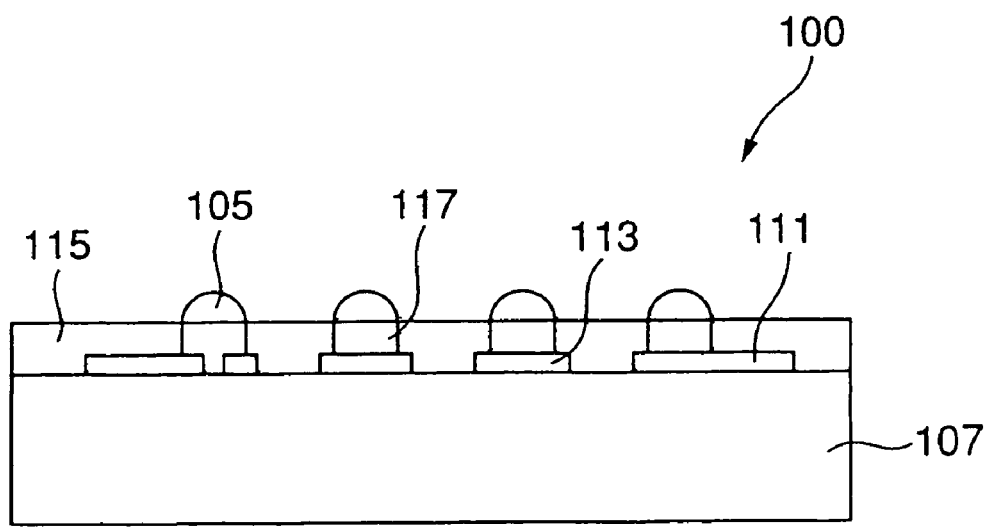
FIG. 3 is a schematic sectional view along line 3—3 of FIG. 2.

FIG. 2 shows a face side of a semiconductor device 100 after being cut out as an individual piece. In the state of FIG. 2, a sealing resin 115, columnar electrodes 117 and the external terminals 105 are not shown. FIG. 3 is a schematic sectional view along line 3—3 of FIG. 2.

As shown in FIGS. 2 and 3, this semiconductor device 100 has approximately the same outer dimension as the outer dimension of a semiconductor chip. In this embodiment, the semiconductor device 100 is, for example, substantially square, and has a face side (first major surface) on which circuit elements (electronic circuit) are formed and a back side (second major surface) substantially facing this face side.

The semiconductor device 100 also has a semiconductor substrate 107 (also referred to as semiconductor chip), electrode pads 109, a metal wiring layer 111, a sealing resin 115, plural columnar electrodes 117, and the plural external terminals 105.

In a peripheral area on the surface of the semiconductor substrate 107, for example, 16 electrode pads 109 are provided at predetermined intervals. The electrode pads 109 are electrically connected with circuit elements, not shown, formed on the surface of the semiconductor substrate 107.

In a central area on the surface of the semiconductor substrate 107, 16 external terminals 105 are arranged in the form of a matrix. The external terminals 105 are formed on the corresponding columnar electrodes 117, respectively. Moreover, the external terminals 105 are electrically connected with land parts 113 in the metal wiring layer 111 via the corresponding columnar electrodes 117, respectively.

The metal wiring layer 111 functions to substantially shift the positions of the external terminals 105 from the peripheral parts (electrode pads 109) of the semiconductor substrate 107 to the central area of the semiconductor substrate 107. Generally, such a shift is called relocation and therefore the metal wiring layer 111 performing such a shift is called relocation wiring or redistribution wiring. By thus arranging the external terminals 105 functioning as external terminals in the central area of the semiconductor substrate 107, it is possible to relax the pitch between the external terminals of the semiconductor device. In the first embodiment, this metal wiring layer 111 is defined as a first structure.

The sealing resin 115 is formed on the surface of the semiconductor substrate 107 and has a function of protecting the circuit elements, not shown, formed on the surface of the semiconductor substrate 107 from the surrounding environment.

The construction of the semiconductor device 100 will now be described further in detail with reference to FIGS. 4 and 5.

Figure 4:
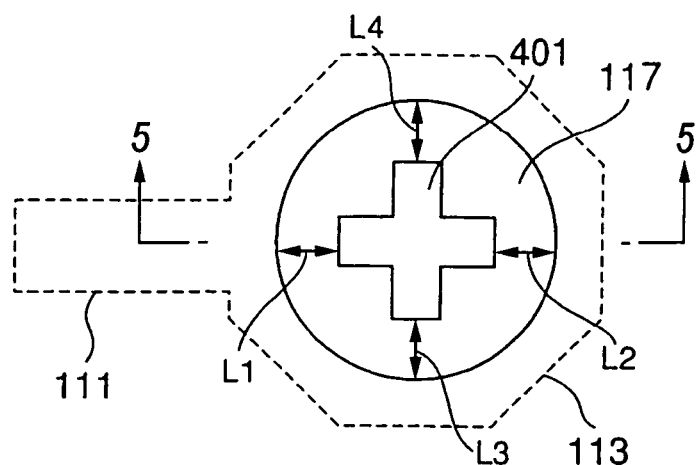
FIG. 4 is an enlarged view showing part A of FIG. 2.

FIG. 4 is an enlarged view showing part A of FIG. 2. FIG. 5 is a schematic sectional view along line 5—5 of FIG. 4.

On the surface (first major surface) of the semiconductor substrate 107 made of silicon, plural circuit elements, not shown, are formed. An insulating layer 501 having a contact hole, not shown, is formed up on each of the circuit elements. A conductive layer, not shown, is formed in the contact hole.

Figure 5:
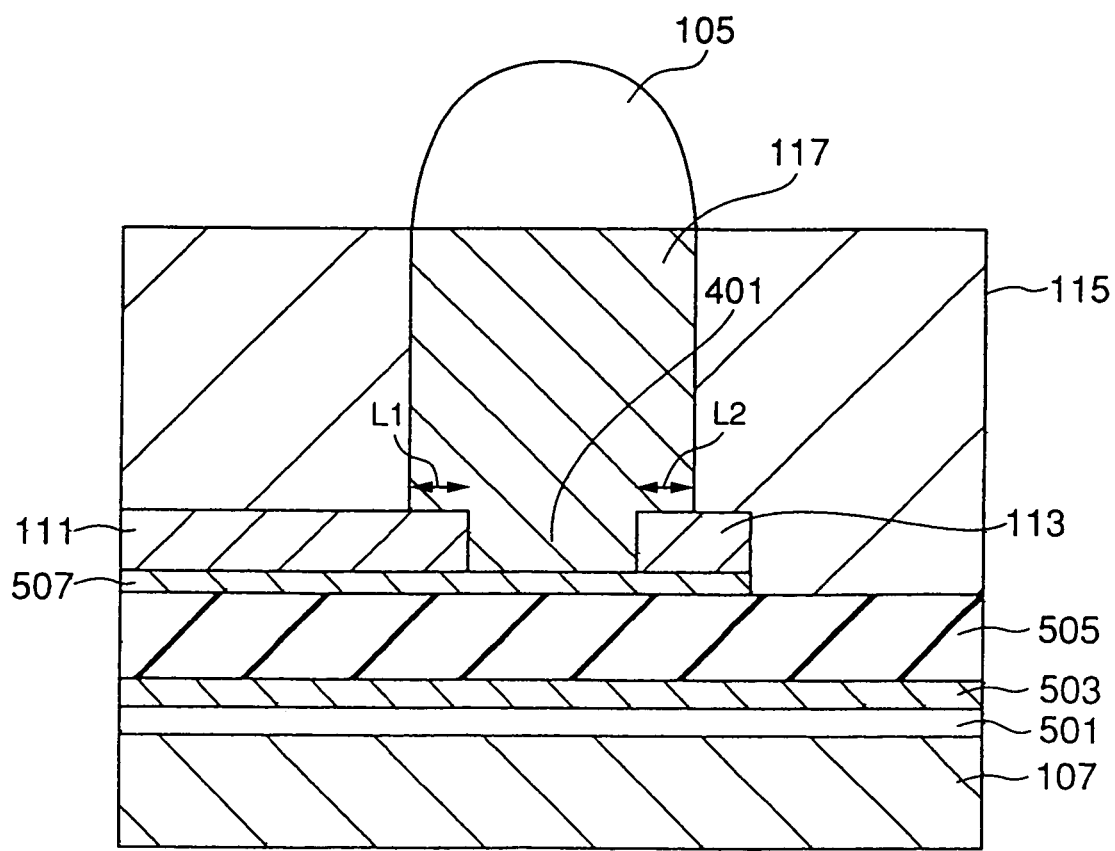
FIG. 5 is a schematic sectional view along line 5—5 of FIG. 4.

Although not shown in FIGS. 4 and 5, the electrode pads 109 are formed on the insulating layer 501. The electrode pads 109 are connected with the corresponding circuit elements via the conductive layers formed in the above-described contact holes. The electrodepads 109 are made of, for example, aluminum containing silicon. The electrode pads 109 will be later described in detail in the description related to a method for manufacturing the semiconductor device 100 of this invention.

A passivation film 503 is formed up on the insulating layer 501 and on circumferential edge parts of the electrode pads 109. This passivation film 503 is made of, for example, silicon nitride.

An interlayer insulating film 505 is formed up on the passivation film 503. The interlayer insulating film 505 is made of, for example, polyimide. The surface of a part of the interlayer insulating film 505 situated right below a metal thin film layer 507, which will be described later, is modified. This modified area is indicated by bold lines. As this modified interlayer insulating film 505 exists, the bonding between the interlayer insulating film 505 and the metal thin film layer 507 improves.

The metal thin film layer 507 is formed on the interlayer insulating film 505 and the electrode pads 109. Although the metal thin film layer 507 may be a single layer or a composite layer, it is preferred that the metal thin film layer 507 is a composite layer including an upper layer and a lower layer. The lower layer film may be made of a material that has a high degree of bonding with the electrode pads 109 and thus can prevent a material forming the upper layer film from diffusing toward the semiconductor substrate 107. This lower layer film is made of, for example, titanium. The upper layer film may be made of a material having a high degree of bonding with the metal wiring layer 111 formed up on the upper layer film. This upper layer film is made of, for example, copper.

The metal wiring layer 111 is formed on the metal thin film layer 507. The metal wiring layer 111 is made of, for example, copper. The metal wiring layer 111 has one end connected with the electrode pad 109 and the other end connected with the columnar electrode 117. This other end is particularly referred as to land part 113.

The land part 113 has a substantially octagonal outer shape and a mark 401 is formed in its central area. This mark 401 formed in the land part 113 is one of the characteristic features of this invention. This mark is a mark for mask alignment and is also a mark for checking a positional gap between the land part 113 of the metal wiring layer 111 and a photoresist opening for forming the columnar electrode 117, which will be described later. The functions of this mark will be described later.

The mark 401 formed in the central area of the land part 113 is formed as a cross-shaped recess part. Specifically, the mark 401 is formed as a part of the copper forming the land part 113 is removed.

The columnar electrode 117, which is a conductive member, is formed on the land part 113 of the metal wiring layer 111. In the example shown in FIGS. 4 and 5, the shape of the columnar electrode 117 is substantially columnar. Since the mark 401 is formed in the central area of the land part 113, the columnar electrode 117 is formed on the land part 113 in a way of filling the mark 401. Specifically, the bottom side of the columnar electrode 117 is in contact with the surface of the land part 113 and the metal thin film layer 507, and its top part is in contact with the external terminal 105. This columnar electrode 117 is made of the same material as that of the metal wiring layer 111 and has a height of approximately 100 μm (distance from the surface of the metal wiring layer 111 to the surface of the sealing resin 115).

In an ideal state, that is, in a state where mask alignment is accurately carried out, the distances L1, L2, L3 and L4 between the peripheral edge of the columnar electrode 117 and the peripheral edges of the mark 401 are equal. In the first embodiment, this columnar electrode 117 is defined as a second structure.

The sealing resin 115 is formed on the entire surface of the semiconductor substrate 107 so that the entire surface of the semiconductor substrate 107 is covered except for the top part of the columnar electrode 117. That is, the sealing resin 115 covers the interlayer insulating film 505, the metal thin film layer 507, the metal wiring layer 111 and the side surface of the columnar electrode 117. The surface of the sealing resin 115 and the top part of the columnar electrode 117 are situated in the same plane. The sealing resin 115 is made of, for example, an opaque epoxy resin.

The external terminal 105 is formed up on the columnar electrode 117. The external terminal 105 is an electrode that will be later connected with a wiring on a mounting board, not shown. Therefore, the circuit elements formed on the semiconductor substrate 107 are connected with an external device via the electrode pads 109, the metal thin film layer 507, the metal wiring layer 111, the columnar electrodes 117 and the external terminals 105. In this manner, the external terminals 105 function as external terminals of the semiconductor device 100. The external terminals 105 are made of, for example, solder.

Now, a method for manufacturing the semiconductor device 100 of the first embodiment of this invention will be described hereinafter.

To make the description easy to understand, only the parts corresponding to FIGS. 4 and 5 will be described.

First, the plural circuit elements, not shown, are formed on the surface (first major surface) of the semiconductor substrate 107, which is in the form of a semiconductor wafer. Next, the insulating layer 501 having a contact hole, not shown, is formed on each of the circuit elements. A conductive layer, not shown, is formed in the contact hole. Next, an aluminum film containing silicon is deposited on the insulating layer 501 by a sputtering method. After that, this aluminum is etched into a predetermined shape and left as the electrode pad 109 on the insulating layer 501, as shown in FIGS. 6A and 6G. The electrode pad 109 is connected with the conductive layer, not shown, formed inside the above-described insulating layer 501. (FIG. 6A)

Next, the passivation film 503 made of a silicon nitride film is formed on the insulating layer 501 and the electrode pad 109 by a CVD method. After that, a part of the passivation film 503 situated on the central area of the electrode pad 109 is removed by etching. (FIG. 6B)

Next, the interlayer insulating film 505 made of polyimide is formed on the passivation film 503 and the electrode pad 109. (FIG. 6C)

Next, a part of the interlayer insulating film 505 situated on the central area of the electrode pad 109 is removed by etching. (FIG. 6D)

Next, as heat treatment is carried out, the interlayer insulating film 505 made of polyimide is thermoset. Through this thermosetting, the part of the interlayer insulating film 505 situated on the electrode pad 109 becomes tapered, as shown in FIG. 6E. If the polyimide is left on the surface of the electrode pad 109, the polyimide is removed by plasma etching in an oxygen atmosphere. (FIG. 6E)

Next, as the interlayer insulating film 505 is exposed to plasma etching in an inert gas atmosphere such as argon gas, the surface of the interlayer insulating film 505 is modified. The modified surface layer is indicated by bold lines. The existence of this surface layer improves the bonding with the metal thin film 507 that is to be formed at the next step. (FIG. 6F)

Next, the metal thin film layer 507 is formed on the interlayer insulating film 505 and the electrode pad 109 by a sputtering method. This metal thin film layer 507 functions as a seed layer for the metal wiring layer 111 and the columnar electrode 117 that are to be formed by plating processing. (FIG. 6G)

Next, a photoresist 701 is formed on the entire surface of the metal thin film layer 507. The photoresist 701 has a thickness of, for example, approximately 10 µm. Subsequently, as predetermined exposure and development are carried out, a part of the photoresist 701 situated in a metal wiring layer forming area 703 and a part of the photoresist 701 situated near the peripheral edge of the semiconductor wafer, not shown, are removed by etching, and a plating resist pattern is thus formed. Therefore, this plating resist pattern has an opening 705 corresponding to an area where the metal wiring layer 111 is to be formed. In the opening 705, a resist 707 is left which is cross-shaped as viewed from the top. Leaving the cross-shaped resist 707 in the opening 705 is one of the characteristic features of the first embodiment. Moreover, the surface of the part of the metal thin film layer 507 situated near the peripheral edge of the semiconductor wafer is exposed through the opening of the plating resist pattern. This exposed part of the metal thin film layer 507 functions as a plating electrode in a plating process.

Figure 7A:
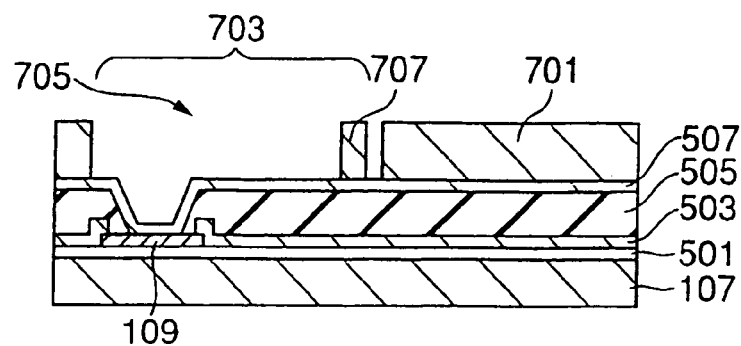
FIGS. 7A to 7E are process diagrams showing the method for manufacturing the semiconductor device 100 of the first embodiment of this invention.

The predetermined exposure and development in forming the plating resist pattern are carried out, using a photolithography technique in a semiconductor device manufacturing process. More specifically, in the exposure process, the alignment mark formed on the semiconductor substrate 107 is recognized by a mark detector of an optical device such as a stepper. On the basis of this information, alignment between the mask for forming the plating resist pattern and the semiconductor substrate 107 (semiconductor wafer) is carried out by the optical device. (That is, mask alignment is carried out.) The development process is carried out as a developer is supplied onto the photoresist 701. (FIG. 7A)

Next, electroplating is carried out using the plating resist pattern as a mask and the metal thin film layer 507 as a current path for plating. As a result, the metal wiring layer 111 is selectively formed in the opening 705 of the plating resist pattern.

Figure 7B:
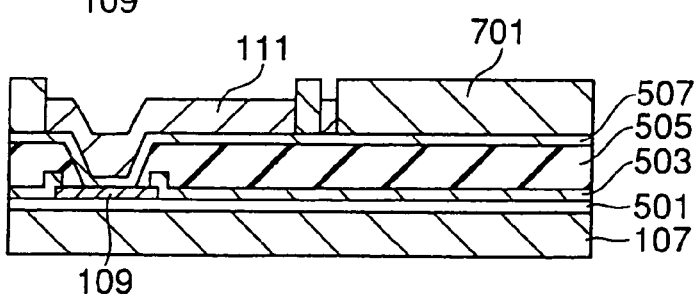

The thickness of the metal wiring layer 111 is less than the thickness of the photoresist 701. It is, for example, 5 µm. (FIG. 7B)

Figure 7C:
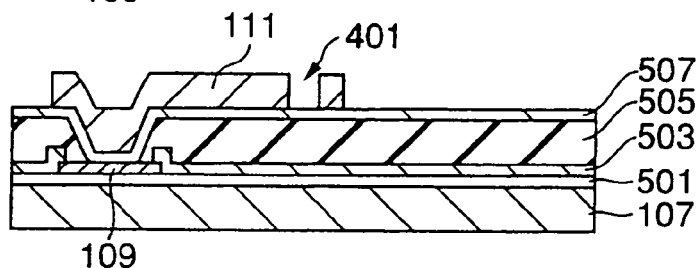

Next, the photoresist 701 is removed using a remover such as acetone. At a part of the metal wiring layer 111 situated in the central area of the land part 113, a recess part is formed as shown in the drawings. This recess part is the above-described mark 401. Forming this recess part in the metal wiring layer 111 is one of the characteristic features of the first embodiment. (FIG. 7C)

Next, the metal thin film layer 507 and the metal wiring layer 111 are laminated with a dry photoresist 709 having a thickness of approximately 120 µm. Subsequently, as predetermined exposure and development are carried out, a part of the dry photoresist 709 situated on the landpart 113 including the mark 401 is removed by etching, and a plating resist pattern is thus formed. Therefore, this plating resist pattern has an opening 711 corresponding to the area where the columnar electrode 117 is to be formed.

The predetermined exposure and development in forming the plating resist pattern are carried out, using a photolithography technique in a semiconductor device manufacturing process. More specifically, in the exposure process, the cross-shaped mark 401 is recognized by a mark detector of an optical device such as a stepper via the dry photoresist 709. As a result, the position of the land part 113 is recognized by the optical, device. On the basis of this position information, alignment between the mask for forming the plating resist and the semiconductor substrate 107 (semiconductor wafer) is carried out by the optical device. (That is, mask alignment is carried out.) In this exposure process, the mark 401 is used as an alignment mark. Using the mark 401 formed on the land part 113 of the metal wiring layer 111 as an alignment mark is one of the characteristic features of the first embodiment.

In the conventional exposure process, mask alignment is carried out using the outer shape of the land part 113 having obtuse angles. However, since the dry photoresist 709 for forming the columnar electrode has a relatively large thickness as described above, the accuracy of recognizing the position of the land part by the optical device is not good. Thus, in this embodiment, the mark 401 intentionally provided in the land part 113 is used as an alignment mark. This mark 401 is provided at a specified position (one or several positions) of the plural land parts 113. Therefore, the land part 113 where the mark 401 is provided can be identified from the adjacent plural land parts 113. Moreover, the outer shape of the mark 401 has 12 bending points. At these bending points, the adjacent sides form an angle of 90 degrees, which is smaller than the angle formed at the corners of an octagon. Therefore, the contour of the mark 401 can be accurately recognized from above the thick dry photoresist 709. This significantly improves the error in the alignment, compared with the conventional technique.

Figure 7D:
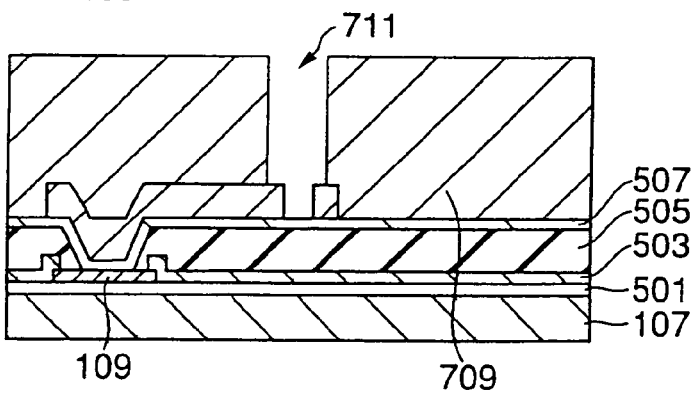

The mark 401 is formed in the area where the metal wiring layer 111 (redistribution wiring) is formed. Therefore, the problem of increase in the chip size due to the provision of an alignment mark does not occur. The development process is carried out as a developer is supplied onto the dry photoresist 709. (FIG. 7D)

Figure 7E:
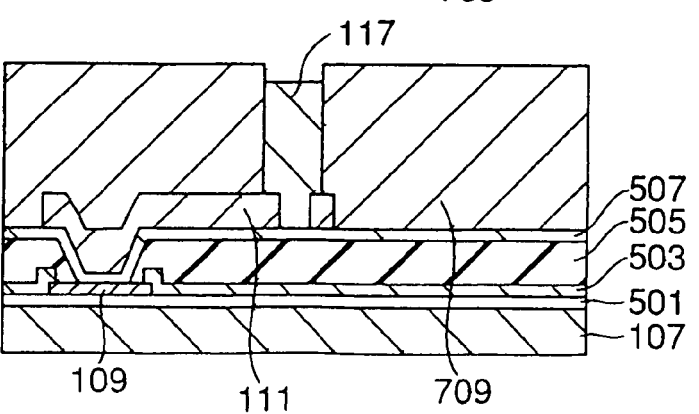

Next, electroplating is carried out using the plating resist pattern as a mask and the metal thin film layer 507 as a current path for plating. As a result, the columnar electrode 117 is selectively formed in the opening 711 of the plating resist pattern. Since the columnar electrode 117 is made of the same substance as that of the metal wiring layer 111, a plating solution used in FIG. 7B can be used. The thickness of the columnar electrode 117 is slightly smaller than the thickness of the dry photoresist 709. It is, for example, approximately 100 μm. (FIG. 7E)

Figure 8A:
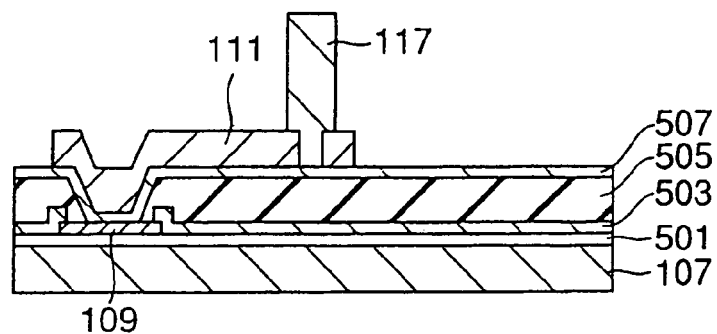
FIGS. 8A to 8D are process diagrams showing the method for manufacturing the semiconductor device 100 of the first embodiment of this invention.

Then, the dry photoresist 709 is removed using a remover. (FIG. 8A)

Figure 8B:
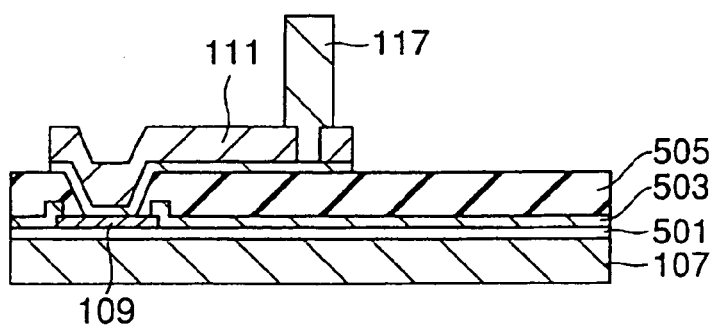

Next, the exposed metal thin film layer 507 is removed as it is exposed to plasma etching in an oxygen gas atmosphere. (FIG. 8B)

Figure 8C:
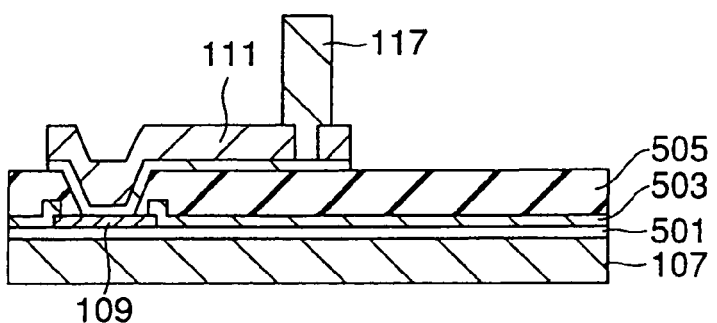

Next, the surface layer of the exposed interlayer insulating film 505 is removed by wet etching. This prevents a current flowing through the metal wiring layer 111 from leaking to the other metal wiring layers 111 through this surface layer. (FIG. 8C)

Figure 8D:
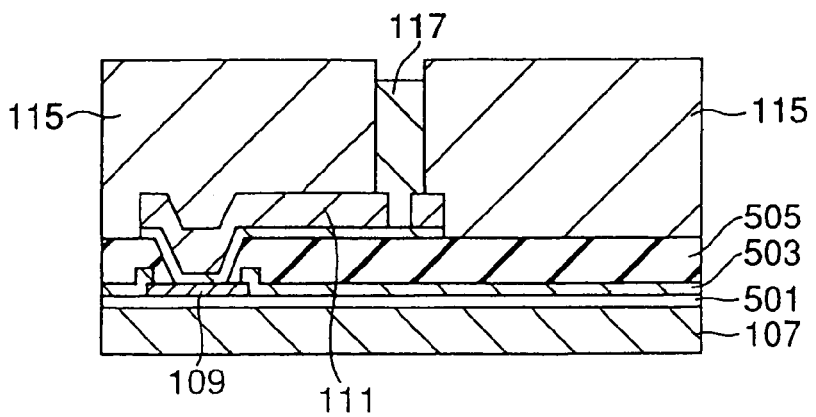

Next, the semiconductor wafer 101 is inserted into a sealing metal mold, not shown. Then, as a sealing resin is injected into the sealing metal mold, the sealing resin 115 is formed on the face side of the semiconductor substrate 107. The sealing resin 115 covers the interlayer insulating film 505, the metal thin film layer 507, the metal wiring layer 111 and the side surface of the columnar electrode 117, as shown in FIG. 8D. (FIG. 8D)

Next, the surface of the sealing resin 115 is polished to expose the top surface of the columnar electrode 117. The surface of the sealing resin 115 and the top surface of the columnar electrode 117 are situated in the same plane.

Figure 9:
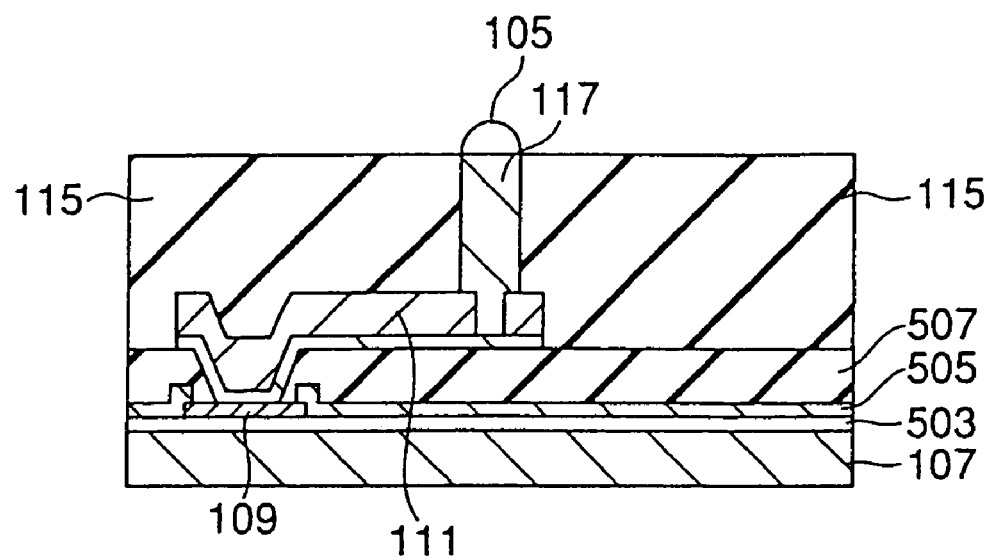
FIG. 9 is a process diagram showing the method for manufacturing the semiconductor device 100 of the first embodiment of this invention.

Next, the external terminal 105 is formed on the top surface of the columnar electrode 117 by a screen printing method. The external terminal 105 is made of, for example, solder. (FIG. 9)

Through the above-described process, plural semiconductor devices 100 are provided in the form of a wafer.

The above-described mark 401 also functions as a mark for checking a position gap in the above-described mask alignment, as will be described hereinafter. Using the mark 401 formed in the land part 113 of the metal wiring layer 111 as a mark for checking a positional gap in the mask alignment is one of the characteristic features of the first embodiment.

Specifically, the check of a positional gap in the above-described mask alignment is carried out as follows.

First, as shown in FIGS. 7D and 7E, as the mask alignment is carried out, the position of the opening 711 of the plating resist pattern is decided. After that, the columnar electrode 117 is formed at the position of this opening 711.

FIGS. 4 and 5 show the state where the mask alignment is accurately carried out. In this state, the distances L1, L2, L3 and L4 between the peripheral edge of the columnar electrode 117 and the peripheral edges of the mark 401 are equal. However, if an error occurs in the alignment, for example, the distance L1 and the distance L2 are not equal in FIG. 5. This means that an error occurred in the alignment. This error can be checked by measuring the distances between the peripheral edge of the opening 711 and the peripheral edges of the mark 401 (that is, the distance L1 and the distance L2) in FIG. 7D. In short, the mark 401 functions as a mark for checking a positional gap in the mask alignment.

If the distance L1, the distance L2, the distance L3 and the distance L4 are not equal in FIG. 7D, or if the values of the distance L1, the distance L2, the distance L3 and the distance L4 are deviated from an allowable range, the dry photoresist 709 is removed. After that, the metal thin film layer 507 and the metal wiring layer 111 are laminated again with the dry photoresist 709. Then, the mask alignment is carried out again. As a result, the columnar electrode 117 can be formed accurately at a predetermined position. Moreover, when checking a positional gap in the mask alignment, the mark 401 is not covered with the dry photoresist 709. That is, since the mark 401 exists in the opening 711 of the dry photoresist 709, it is very easy to check a positional gap in the mask alignment.

Next, a scribing process (dicing process) is carried out and plural semiconductor devices 100 are provided. In this scribing process, the positions of the columnar electrode 117 and the external terminal 105 formed on the columnar electrode 117 are used as marks for recognizing the scribing position (dicing position). As the above-described mark 401 is used, the columnar electrode 117 is accurately formed at a preset position (intended position on the redistribution wiring). Therefore, the scribing position does not deviate from a preset position. That is, the accuracy of the scribing process is improved, compared with the conventional technique.

Figure 10:
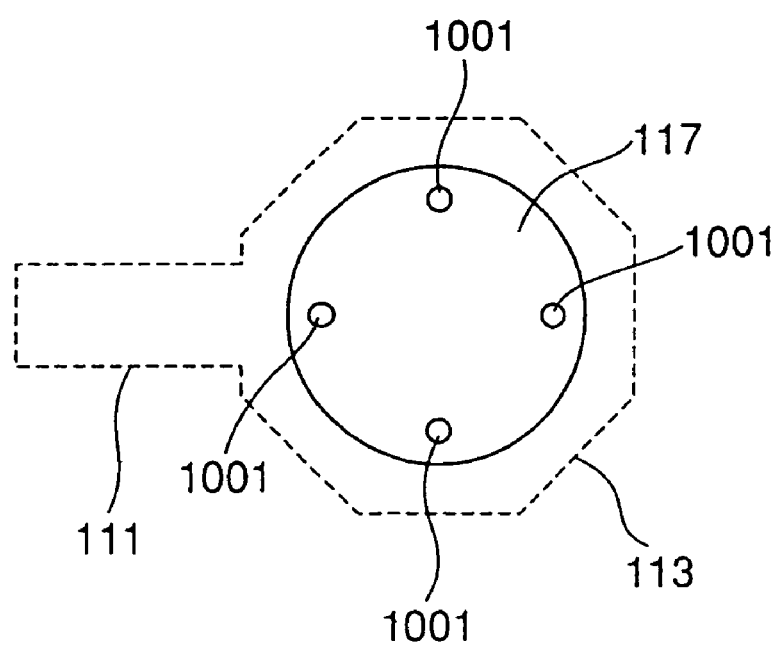
FIG. 10 is a plan view showing a modification of the semiconductor device 100 of the first embodiment of this invention.

In the above description, the cross-shaped mark 401 is described as an example. However, the shape of the mark 401 is not limited to this shape and may be other forms without departing from the scope of this invention. For example, marks 1001 as shown in FIG. 10 may be used.

As described above in detail, according to this embodiment, mainly the following effects can be achieved.

The mark 401 functioning as a mask alignment mark or functioning as a mark for checking a positional gap is formed at the same time in the process of forming the metal wiring layer 111 (redistribution wiring). Therefore, the alignment accuracy can be improved without adding any special process step.

The mark 401 functioning as a mask alignment mark or functioning as a mark for checking a positional gap is formed in the metal wiring layer 111 (redistribution wiring) itself. Therefore, the chip size is not increased. Generally, the diameter of the columnar electrode is set to be approximately half the pitch between the external terminals. For example, if the pitch between the external terminals is 0.5 mm, the diameter of the columnar electrode is set to be approximately 0.25 mm. This means that a relatively large mark can be provided as a mark. Therefore, improvement in the mask alignment accuracy using an image recognition technique and improvement in the accuracy of appearance check using an image recognition technique can be expected.

Moreover, this mark 401 is completely embedded by the columnar electrode 117, which is formed later. Therefore, the strength and the electrical properties of the semiconductor device are not lowered.

As a result, the accuracy of the scribing process can be improved while the above-described effects are maintained.

(Second Embodiment)

The structure of a semiconductor device 100 and its manufacturing method according to a second embodiment of this invention will now be described with reference to FIGS. 11A–11C to FIG. 14.

In the second embodiment, the semiconductor device 100 has a redistribution wiring of a multilayer wiring structure. In the following description, the redistribution wiring having two layers is described as an example. The process up to formation of a redistribution wiring of a first layer is substantially the same as the first embodiment and therefore will not be described further in detail.

First, the redistribution wiring of the first layer including the metal thin film layer 507 and the metal wiring layer 111 is formed on the interlayer insulating film 505, as shown in FIG. 7C. However, the mark 401 is not provided in the redistribution wiring of the first layer.

Figure 11A:
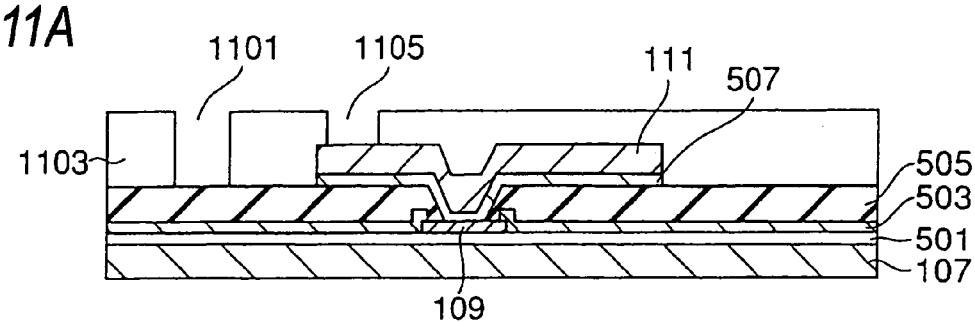
FIGS. 11A to 11C are process diagrams showing a method for manufacturing a semiconductor device 100 of a second embodiment of this invention.

Next, an interlayer insulating film 1103 is formed on the entire surface of the semiconductor wafer 101. Next, an opening 1101 and an opening 1105 are formed in the interlayer insulating film 1103, using a known photolithography technique. The opening 1101 functions as a mark 1101, which will be described later. The opening 1105 functions as a through-hole 1105 connecting the redistribution wiring of the first layer and the redistribution wiring of the second layer. In the second embodiment, this interlayer insulating film 1103 is defined as a first structure. (FIG. 11A)

Figure 11B:
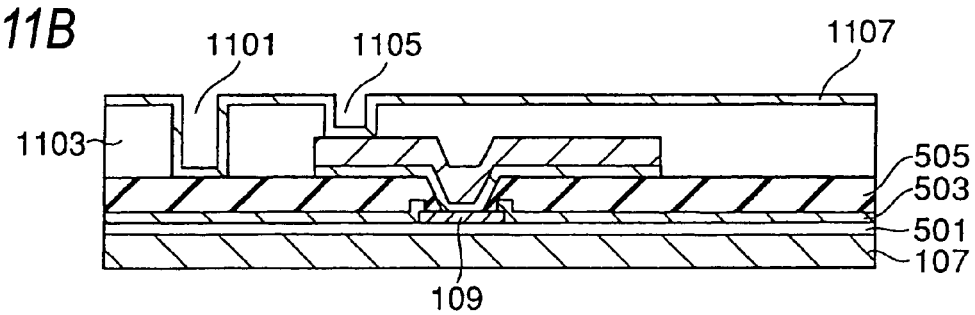

Next, a metal thin film layer 1107 is formed on the interlayer insulating film 1103 by a sputtering method. This metal thin film layer 1107 functions as a seed layer for a metal wiring layer 1201 (redistribution wiring of the second layer) and the columnar electrode 117, which are formed by plating processing. (FIG. 11B)

Next, a photoresist 1109 is formed on the entire surface of the metal thin film layer 1107. The photoresist 1109 has a thickness of, for example, approximately 10 μm.

Then, as predetermined exposure and development are carried out, a part of the photoresist 1109 situated on the metal thin film layer 1107 including the mark 1101 and the through-hole 1105 and a part of the photoresist 1109 situated near the peripheral edge of the semiconductor wafer, not shown, are removed by etching, and a plating resist pattern is formed.

This plating resist pattern has an opening 1113 corresponding to an area 1111 where the metal wiring layer 1201 (redistribution wiring of the second layer) is to be formed. In the opening 1113 of the plating resist pattern, the mark 1101 and the through-hole 1105 exist. This structure can be easily understood with reference to a plan view of FIG. 13.

Figure 11C:
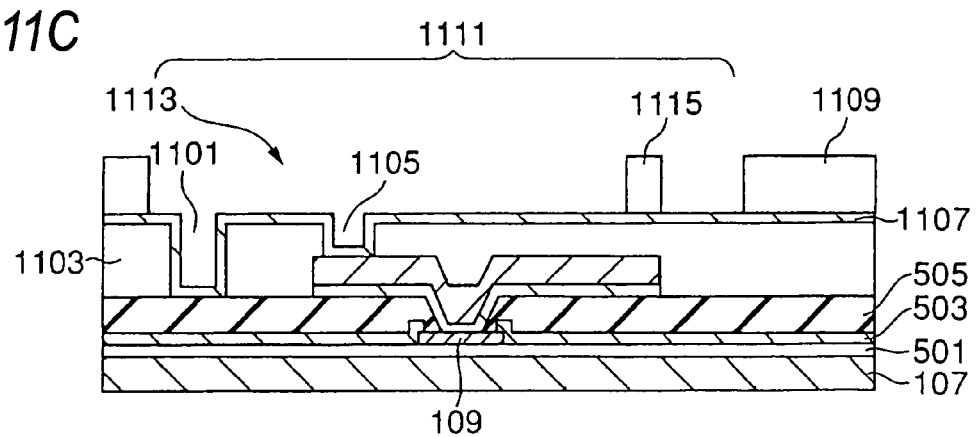
Figure 13:
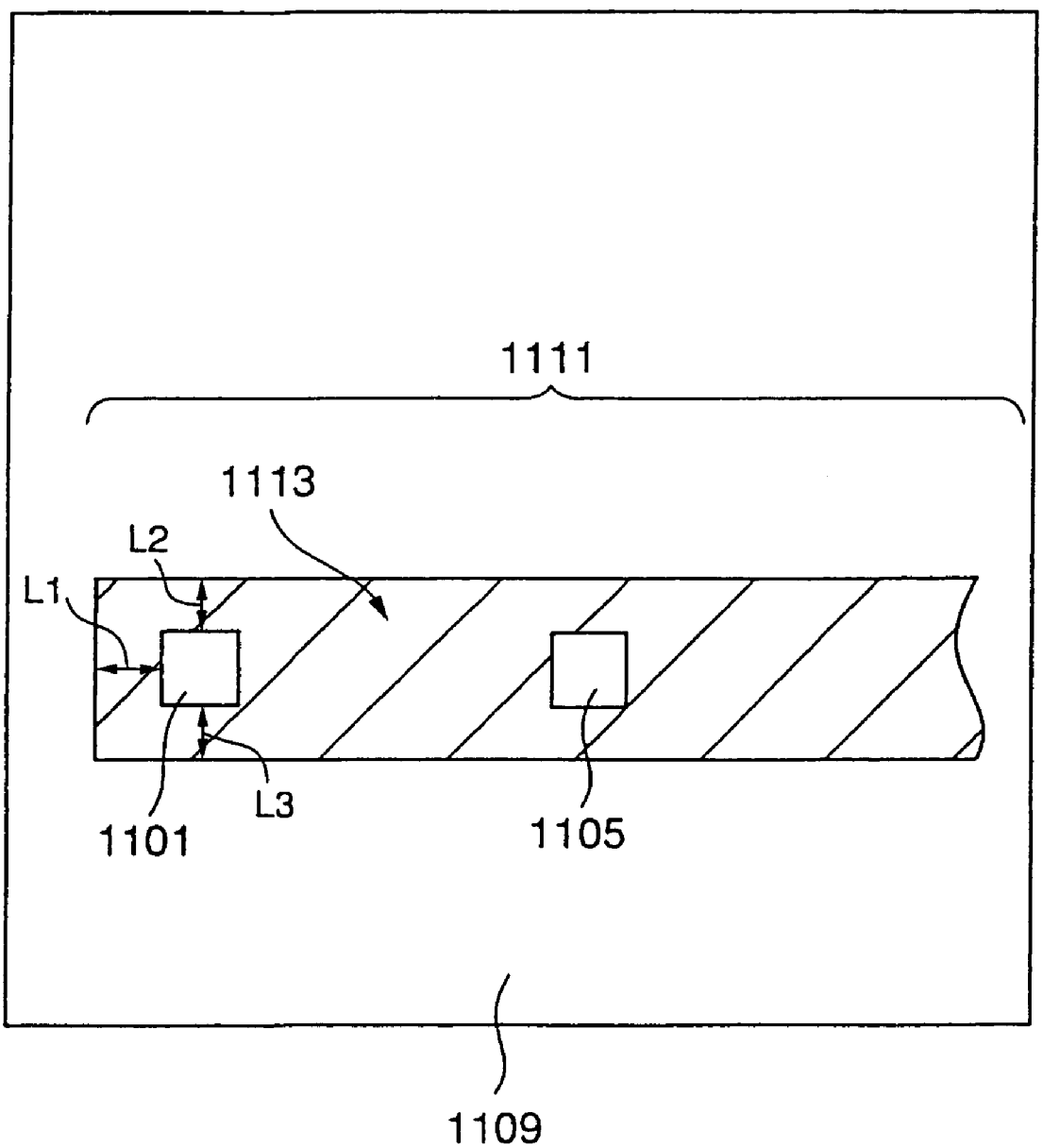
FIG. 13 is an enlarged schematic plan view in the process of FIG. 11C.

FIG. 13 is an enlarged schematic plan view in the process of FIG. 11C. FIG. 13 shows that the plating resist pattern 1109 having the opening 1113 is formed and that the mark 1101 and the through-hole 1105 exist in the opening 1113. In this opening 1113, the mark 1101 and the through-hole 1105 exist.

Moreover, a resist 1115 that is cross-shaped as viewed from the top is left in the opening 1113. This cross-shaped resist 1115 is similar to the cross-shaped resist described in the first embodiment. Therefore, in FIG. 13, the cross-shaped resist is not shown or described.

The predetermined exposure and development in forming the plating resist pattern are carried out, using a photolithography technique in a semiconductor device manufacturing process. More specifically, in the exposure process, the mark 1101 is recognized by a mark detector of an optical device such as a stepper via the photoresist 1109. As a result, the position of the mark 1101 is recognized by the optical device. On the basis of this position information, alignment between the mask for forming the plating resist and the semiconductor substrate 107 (semiconductor wafer) is carried out by the optical device. (That is, mask alignment is carried out.) In this exposure process, the mark 1101 is used as an alignment mark. Using the mark 1101 intentionally formed in the interlayer insulating film 1103 as an alignment mark is one of the characteristic features of the second embodiment.

Moreover, the surface of a part of the metal thin film layer 1107 situated near the peripheral edge of the semiconductor wafer is exposed by the opening of the plating resist pattern. This exposed part of the metal thin film layer 1107 functions as a plating electrode in a plating process.

Next, electroplating is carried out using the plating resist pattern as a mask and the metal thin film layer 1107 as a current path for plating. As a result, the metal wiring layer 1201 is selectively formed in the opening 1113 of the plating resist pattern.

Figure 12A:
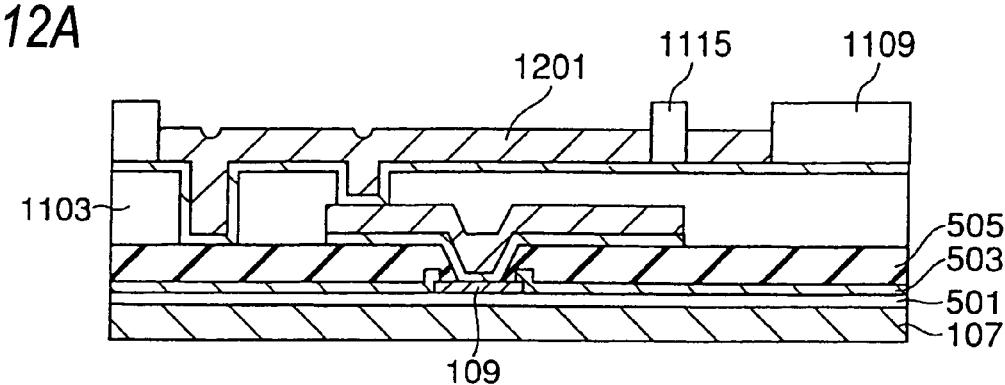
FIGS. 12A to 12C are process diagram showing the method for manufacturing the semiconductor device 100 of the second embodiment of this invention.

The thickness of the metal wiring layer 1201 is less than the thickness of the photoresist 1109. It is, for example, 5 μm. In the second embodiment, this metal wiring layer 1201 is defined as a second structure (FIG. 12A)

Figure 12B:
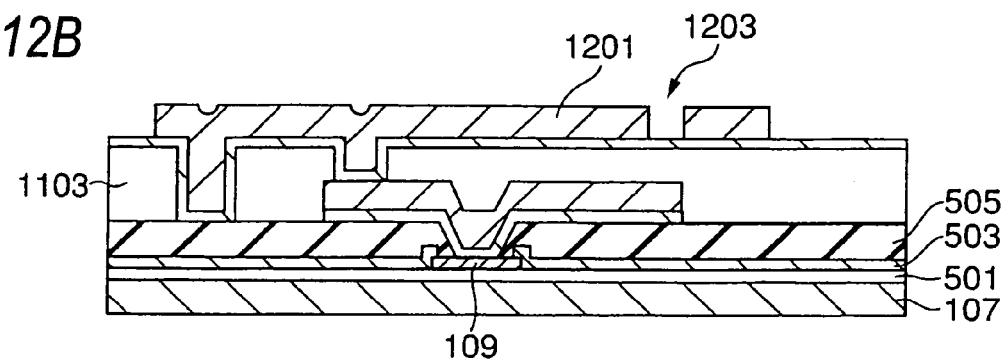
Figure 12C:
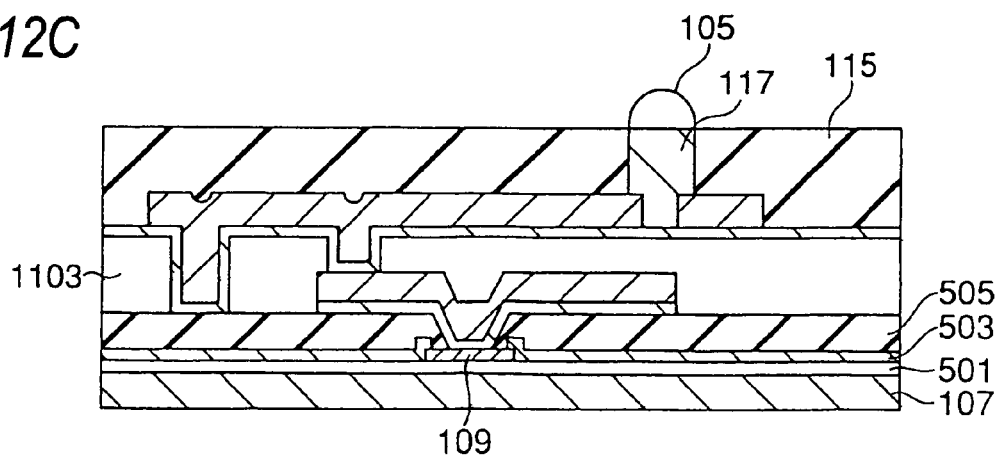

Next, the photoresist 1109 is removed using a remover such as acetone. At a part of the metal wiring layer 1201 corresponding to the central area of the land part, a recess part 1203 is formed as shown in the drawings. This recess part is the mark described in the first embodiment. (FIG. 12B)

The subsequent process is substantially the same as the process shown in FIGS. 7D to 9 and therefore will not be described further in detail.

The above-described mark 1101 also functions as a mark for checking a positional gap in the mask alignment, as will be described hereinafter. Using the mark 1101 formed in the interlayer insulating film 1113 as a mark for checking a positional gap in the mask alignment is one of the characteristic features of the second embodiment.

Specifically, the check of a positional gap in the mask alignment is carried out as follows.

First, as shown in FIG. 11C, as the mask alignment is carried out, the position of the opening 1113 of the plating resist pattern is decided. After that, the metal wiring layer 1201 (redistribution wiring of the second layer) is formed at the position of this opening 1113.

FIG. 13 shows the state where the mask alignment is accurately carried out. In this state, the distances L1, L2 and L3 between the inner rims of the photoresist 1109 and the peripheral edges of the mark 1101 are equal. However, if an error occurs in the alignment, for example, the distance L2 and the distance L3 are not equal in FIG. 13. This means that an error occurred in the alignment. This error can be checked by measuring the distances between the inner rims of the photoresist 1109 and the peripheral edges of the mark 1101 (that is, the distance L2 and the distance L3) in FIG. 11C. In short, the mark 1101 functions as a mark for checking a positional gap in the mask alignment.

If the distance L1, the distance L2 and the distance L3 are not equal in FIG. 11C, or if the values of the distance L1, the distance L2 and the distance L3 are deviated from an allowable range, the photoresist 1109 is removed. After that, the photoresist 1109 is formed again on the metal thin film layer 1107. Then, the mask alignment is carried out again. As a result, the metal wiring layer 1201 (redistribution wiring of the second layer) can be formed accurately at a predetermined position. Moreover, when checking a positional gap in the mask alignment, the mark 1101 is not covered with the photoresist 1109. That is, since the mark 1101 exists in the opening 1113 of the photoresist 1109, it is very easy to check a positional gap in the mask alignment.

The position where the mark 1101 is provided and the shape of the mark 1101 are not limited to the above-described position and shape and maybe other positions and shapes without departing from the scope of the invention. For example, a mark 1401 as shown in FIG. 14 may be used.

Figure 14:
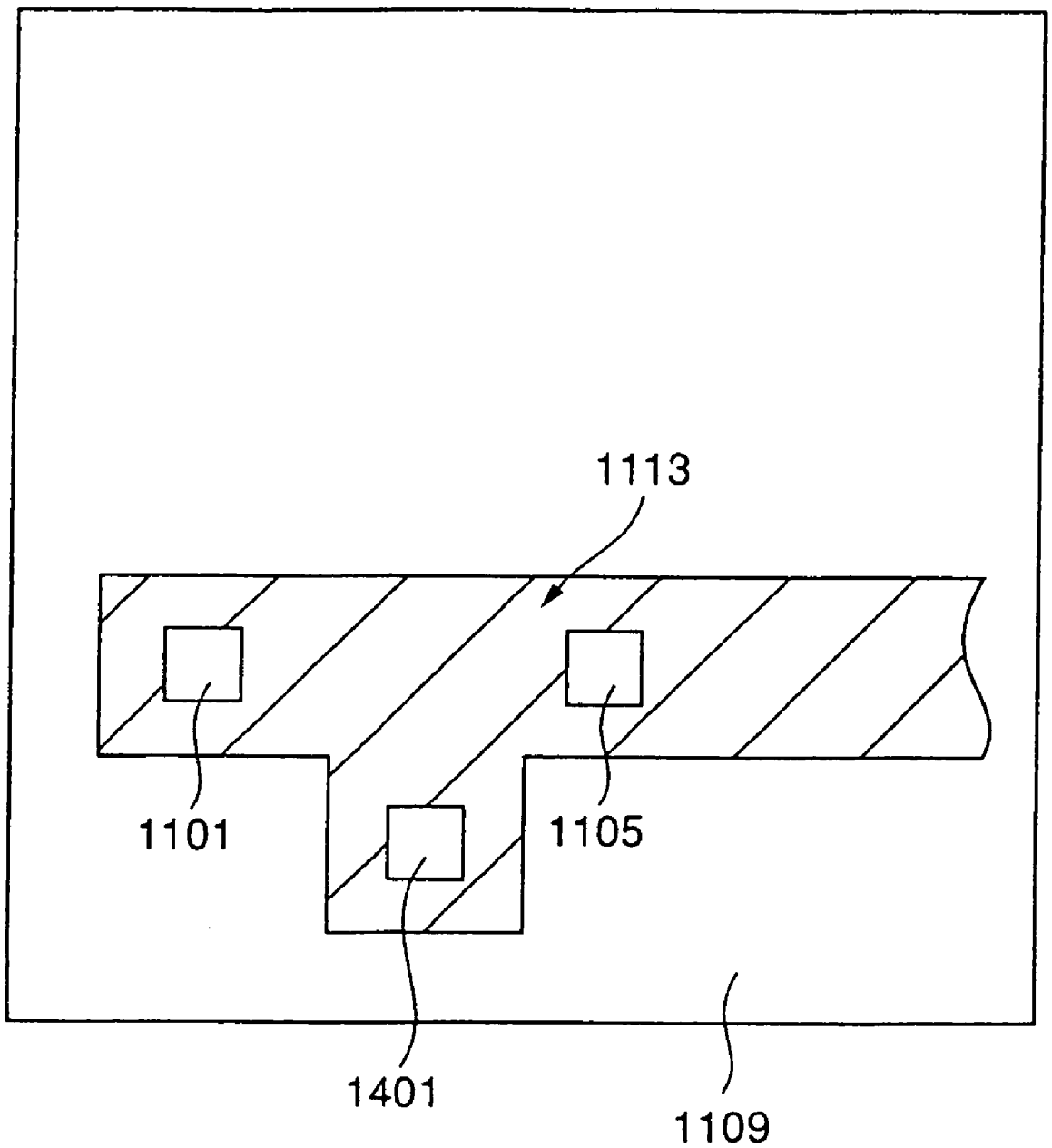
FIG. 14 is an enlarged schematic plan view corresponding to the process of FIG. 11C.

FIG. 14 is an enlarged schematic plan view corresponding to the process of FIG. 11C. FIG. 14 shows that the plating resist pattern 1109 having the opening 1113 is formed and that the mark 1101, the mark 1401 and the through-hole 1105 exist in the opening 1113. In this opening 1113, the mark 1101, the mark 1401 and the through-hole 1105 exist.

One of the differences between FIG. 14 and FIG. 13 is that the additional mark 1401 is provided in the interlayer insulating film 1103. Because of this difference, the shape of the opening 1113 is different from the shape of the opening 1113 shown in FIG. 13.

In the semiconductor device shown in FIG. 14, the mark 1401 as well as the mark 1101 is used as an alignment mark or a mark for checking a positional gap in the mask alignment. Therefore, the mask alignment accuracy and the accuracy of checking a positional gap in the mask alignment can be improved further.

As described above in detail, according to this embodiment, mainly the following effects can be achieved.

The mark 1101 (1401) functioning as a mask alignment mark or functioning as a mark for checking a positional gap is formed at the same time in the process of forming the through-hole 1105 connecting the redistribution wiring of the first layer and the redistribution wiring of the second layer. Therefore, the alignment accuracy can be improved without adding any special process step.

Moreover, the mark 1101 (1401) is completely embedded by the redistribution wiring of the upper layer, which is formed later. Therefore, the strength of the semiconductor device is not lowered.

Figure 15:
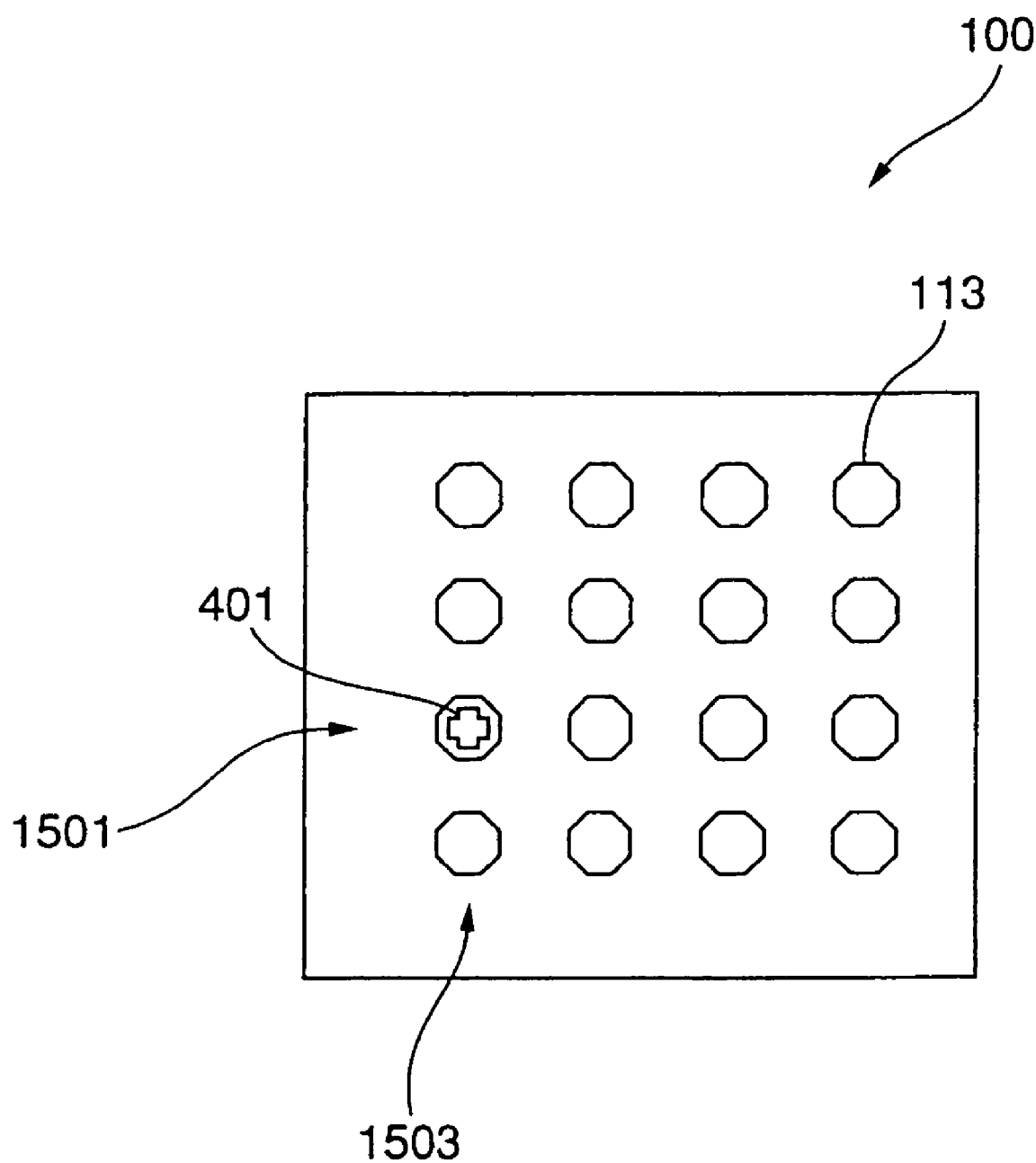
FIG. 15 shows a face side of the semiconductor device 100 after it is cut out as an individual piece.

As a modification of the first embodiment, a structure as shown in FIG. 15 may be considered. FIG. 15 shows a face side of a semiconductor device after being cut out as an individual piece. To make the description easy to understand, FIG. 15 shows a state where the sealing resin 115, the columnar electrodes 117, the external terminals 105, the electrode pads 109, and a part of the redistribution wiring are not shown. Of the redistribution wiring, the land parts 113 and the mark 401 are shown.

The difference between the semiconductor device 100 shown in FIG. 15 and the semiconductor device 100 shown in FIG. 2 is that a mark 1501 and a mark 1503 exist in the semiconductor device of FIG. 15. These marks 1501 and 1503 are provided along the scribing lines 103 and function as position detection marks for specifying the position where the mark 401 is provided. As these marks are provided, the position of the columnar electrode under which the mark 401 is provided can be easily discriminated. In short, the mark 401 exists at a position where a direction indicated by an apex of a triangle of the mark 1501 and a direction indicated by an apex of the mark 1503 cross each other.

These marks can be formed in the same layer as the redistribution wiring. In this case, these marks are formed by plating processing. When these marks are applied to the second embodiment, these marks can be formed in the same layer as the redistribution wiring of the first layer.

What is claimed is:

1. A semiconductor device comprising:
    a semiconductor substrate having a major surface on which a circuit element is formed;
    an electrode pad formed on the major surface and electrically connected with the circuit element;
    a first insulating film formed over the major surface so as to expose a portion of the electrode pad;
    a first wiring layer pattern extending from the electrode pad to a surface of the first insulating film;
    a second insulating film having a first recess part exposing a portion of the first wiring layer pattern and a second recess part, the second insulating film being formed on the first insulating film and the first wiring pattern;
    a second wiring layer pattern formed on the second insulating film including the first recess part and the second recess part;
    a conductive member formed on the second wiring layer pattern;
    a sealing resin covering the second insulating film, the second wiring layer pattern, and a side of the conductive member; and
    an external terminal formed on the conductive member.

2. The semiconductor device as claimed in claim 1, wherein the second wiring layer pattern is not connected with the first wiring layer pattern at the second recess part.

3. The semiconductor device as claimed in claim 1, wherein the second recess part comprises a plurality of recess parts in the second insulating film.

4. The semiconductor device as claimed in claim 1, wherein the second recess part is an alignment mark for forming the second wiring layer pattern.

5. The semiconductor device as claimed in claim 1, wherein the second recess part is a mark for checking a positional gap in alignment when forming a mask pattern for forming the second wiring layer pattern.

* * * * *